United States Patent
Kalidas et al.

(10) Patent No.: US 7,309,648 B2
(45) Date of Patent: Dec. 18, 2007

(54) LOW PROFILE, CHIP-SCALE PACKAGE AND METHOD OF FABRICATION

(75) Inventors: Navinchandra Kalidas, Houston, TX (US); Jeremias P Libres, Garland, TX (US); Michael P Pierce, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/470,306

(22) Filed: Sep. 6, 2006

(65) Prior Publication Data

US 2007/0020808 A1   Jan. 25, 2007

Related U.S. Application Data

(62) Division of application No. 10/916,194, filed on Aug. 10, 2004, now Pat. No. 7,135,781.

(51) Int. Cl.
*H01L 21/44* (2006.01)
*H01L 21/48* (2006.01)

(52) U.S. Cl. ............... 438/617; 438/109; 438/110; 438/127; 257/E23.024; 257/686

(58) Field of Classification Search ............... 438/617, 438/109, 110, 127; 257/E23.024, 784
See application file for complete search history.

(56) References Cited

U.S. PATENT DOCUMENTS

| | | | |
|---|---|---|---|
| 5,072,283 A | 12/1991 | Bolger | |
| 5,519,936 A | 5/1996 | Andros et al. | |
| 5,736,785 A | 4/1998 | Chiang et al. | |
| 5,894,108 A * | 4/1999 | Mostafazadeh et al. | 174/529 |
| 5,976,912 A * | 11/1999 | Fukutomi et al. | 438/110 |
| 6,001,671 A * | 12/1999 | Fjelstad | 438/112 |
| 6,057,601 A | 5/2000 | Lau et al. | |
| 6,215,195 B1 | 4/2001 | Koduri | |
| 6,483,187 B1 | 11/2002 | Chao et al. | |
| 6,723,585 B1 * | 4/2004 | Tu et al. | 438/123 |
| 6,815,836 B2 | 11/2004 | Ano | |
| 2003/0230801 A1 | 12/2003 | Jiang et al. | |
| 2004/0191954 A1 | 9/2004 | Ano | |
| 2005/0156322 A1 | 7/2005 | Smith et al. | |

* cited by examiner

*Primary Examiner*—Nitin Parekh
(74) *Attorney, Agent, or Firm*—Yingsheng Tung; Wade James Brady, III; Frederick J. Telecky, Jr.

(57) ABSTRACT

Disclosed is a semiconductor device that includes an electrically insulating, sheet-like substrate with first and second surfaces, at least one opening, and a certain thickness. On the first surface are a plurality of electrically conductive routing strips and a plurality of contact pads; at least one of the contact pads is electrically connected with at least one of the routing strips, and may have a solder body attached. A semiconductor chip is positioned in the opening while leaving a gap to the substrate; the chip has an active surface including at least one bond pad, and a passive surface substantially coplanar with the second substrate surface. Substrate thickness and chip thickness may be substantially equal. Bonding elements bridge the gap to connect electrically bond pad and routing strip. Encapsulation material protects the active chip surface and the bonding elements, and fills the gap so that the filler surface is substantially coplanar with the passive chip surface and the second substrate surface. The support tape used in assembly is discarded.

8 Claims, 12 Drawing Sheets

LOW PROFILE, CHIP-SCALE PACKAGE AND METHOD OF FABRICATION

This is a division of application Ser. No. 10/916,194 filed Aug. 10, 2004 now U.S. Pat No. 7,135,781.

FIELD OF THE INVENTION

The present invention is related in general to the field of semiconductor devices and more specifically to low-profile, chip-scale multi-chip packages and method for fabrication.

DESCRIPTION OF THE RELATED ART

The strong market trend for consumer products such as mobile phones and other portable, hand-held and wearable products demands semiconductor devices as building blocks, which consume only little area and height, when mounted onto circuit boards. One of the most successful approaches for slim, small-size semiconductor devices has been the development of so-called "chip-scale packages". These packages have an outline adding less than 20% to the chip area; however, their height has not yet reached the desired thin profile.

A widely practiced methodology of assembling and enclosing a semiconductor chip begins with providing a "cavity down" package and assembling the chip in the cavity. The assembly process includes the step of attaching the chip with an adhesive material, followed by the step of wire bonding to connect the chip contact pads with the package terminals. In the wire ball-bonding process, however, the mechanically weak heat-affected zone of the wire necessitates the vertical position of the wire over the ball, leading to the hallmark high looping of wire bonding. The cavity-down package itself features frequently several built-in layers of conducting lines in order to enable the solder ball connection to external parts. The height required by the wire looping and the design of the multi-layer package are hindrances for achieving a thin device profile; in addition, they are not amenable to lowering the fabrication cost.

Portable products further require semiconductor devices with improved thermal characteristics, and often with improved electrical performance, especially higher speed. It is difficult in existing cavity-down packages to bring heat-conducting metal pieces into contact with the semiconductor chip. It is also difficult to lay out short, high-speed, or shielded, lines in multi-layer packages, given the technical constraints of wire bonding and multi-layer package construction.

SUMMARY OF THE INVENTION

The invention is a new concept of assembling a semiconductor chip coplanar with the device package without the need for a cavity; further, the interconnecting line lengths are reduced, one chip surface is freed up for direct heat spreader attachment, the device profile is reduced, and the costs for the package parts as well as for the whole assembly process are reduced. The new methodology is flexible enough to be applied for different semiconductor product families and a wide spectrum of design and assembly variations, and achieves improvements toward the goals of higher process yields and device reliability.

One embodiment of the invention is a semiconductor device comprising an electrically insulating, sheet-like substrate with first and second surfaces, at least one opening, and a certain thickness. On the first surface are a plurality of electrically conductive routing strips and a plurality of contact pads; at least one of the contact pads is electrically connected with at least one of the routing strips, and may have a solder body attached. A semiconductor chip is positioned in the opening while leaving a gap to the substrate; the chip has an active surface including at least one bond pad, and a passive surface substantially coplanar with the second substrate surface. Substrate thickness and chip thickness may be substantially equal. Bonding elements bridge the gap to connect electrically bond pad and routing strip. Encapsulation material protects the active chip surface and the bonding elements, and fills the gap so that the filler surface is substantially coplanar with the passive chip surface and the second substrate surface. Further, a heat spreader may be attached to the coplanar passive chip surface and second substrate surface.

Another embodiment of the invention is a multi-chip module having a substrate with an opening and pluralities of electrically conductive routing strips on both its first and second surfaces. A first chip is in the substrate opening, leaving a first gap to the substrate; the chip's active surface is substantially coplanar with the first substrate surface, and bonding elements bridge the first gap to connect the first chip bond pads to the routing strips of the first substrate surface. A second chip is in the substrate opening, leaving a second gap to the substrate; the chip's active surface is substantially coplanar with the second substrate surface, and bonding elements bridge the second gap to connect the second chip bond pads to the routing strips of the second substrate surface. The passive surfaces of the first and second chips are attached to each other by an adhesive layer. Encapsulation material protects the active chip surfaces and bonding elements, and fills first and second gaps.

Another embodiment of the invention is a method for assembling a semiconductor device comprising a substrate with first and second surfaces and an opening, and a chip with active and passive surfaces positioned in this opening. The method employs a removable support tape having an adhesive upper surface, which serves to align the second substrate surface and the passive chip surface substantially coplanar, and which is discarded after completing the device assembly. The method may further comprise the steps of attaching solder balls to the first substrate surface and a heat spreader to the passive chip surface and coplanar second substrate surface.

Another embodiment of the invention is a method for assembling a semiconductor multi-chip device comprising a substrate with first and second surfaces and an opening, and two chips with active and passive surfaces, attached to each other at their passive surfaces, positioned in this opening. The method employs a removable support tape having an adhesive surface, which serves to align the first substrate surface and the active surface of the first chip substantially coplanar. After attaching the second chip onto the first chip, bonding the second chip's pads to the routing strips of the second substrate surface, and encapsulating the active surface of the second chip and filling the chip-to-substrate gaps, the support tape is discarded. The method concludes with the step of bonding the first chip's pads to the routing strips of the first substrate surface and encapsulating the active surface of the first chip.

The technical advantages represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIGS. 1 to 12 illustrate schematically selected steps of the process flow for fabricating a low-profile chips-scale device according to an embodiment of the invention.

FIG. 2 is a schematic top view of the support tape and chip to be assembled.

FIG. 4 is a schematic top view of the support tape with attached chip and the substrate to be assembled.

FIG. 6 is a schematic top view of the assembled and interconnected substrate and chip.

FIG. 8 is a schematic top view of the encapsulated interconnected chip and substrate assembly.

FIG. 10 shows a schematic top view of the chip and substrate assembly with solder bodies attached.

FIG. 12 illustrates schematically a top view the packaged device after removing the support tape.

FIG. 16 is a schematic cross section of the support tape, the first chip and the substrate.

FIG. 17 schematically illustrates the process step of attaching the second chip onto the first chip.

FIG. 18 schematically illustrates the process step of interconnecting the second chip to the substrate.

FIG. 19 schematically illustrates the process step of encapsulating the second chip and filling the gaps between both chips and the substrate.

FIG. 20 is a schematic cross section of the device after discarding the support tape, flipping the assembly, and interconnecting the first chip to the substrate.

FIG. 21 is a schematic cross section of the assembled device after encapsulating the first chip.

FIG. 22 is a schematic cross section of the encapsulated multi-chip device with solder bodies attached.

DETAILED DESCRIPTION OF THE PREFERRED EMBODIMENTS

The novelty of the fabrication process of the invention and the advantages of the finished semiconductor device are most easily appreciated by following the sequence of the process steps according to an embodiment of the invention. The schematic cross sections of FIGS. 1 and 2 illustrate a support tape 101 with an adhesive surface 101a (preferably low strength for easy removal). In the assembly process flow, this surface 101a is facing upward. Preferably, tape 101 is an electrically insulating polyimide foil in the thickness range from about 25 to 100 µm.

Figure 1A:
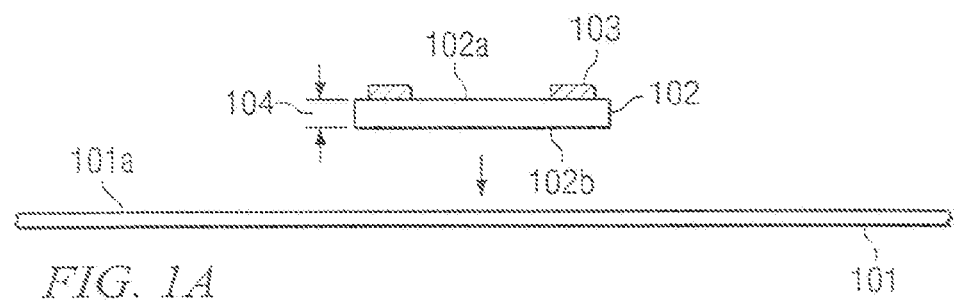
FIG. 1A is a schematic cross section of the support tape and a chip thinner than the substrate.
Figure 1B:
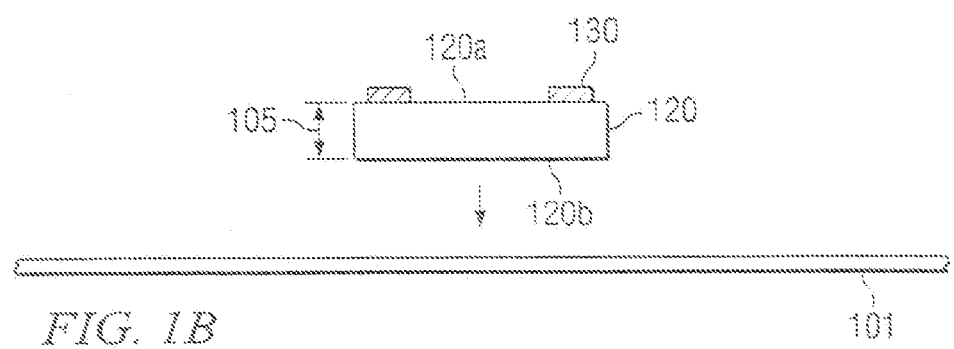
FIG. 1B is a schematic cross section of the support tape and a chip as thick as the substrate.
Figure 2:
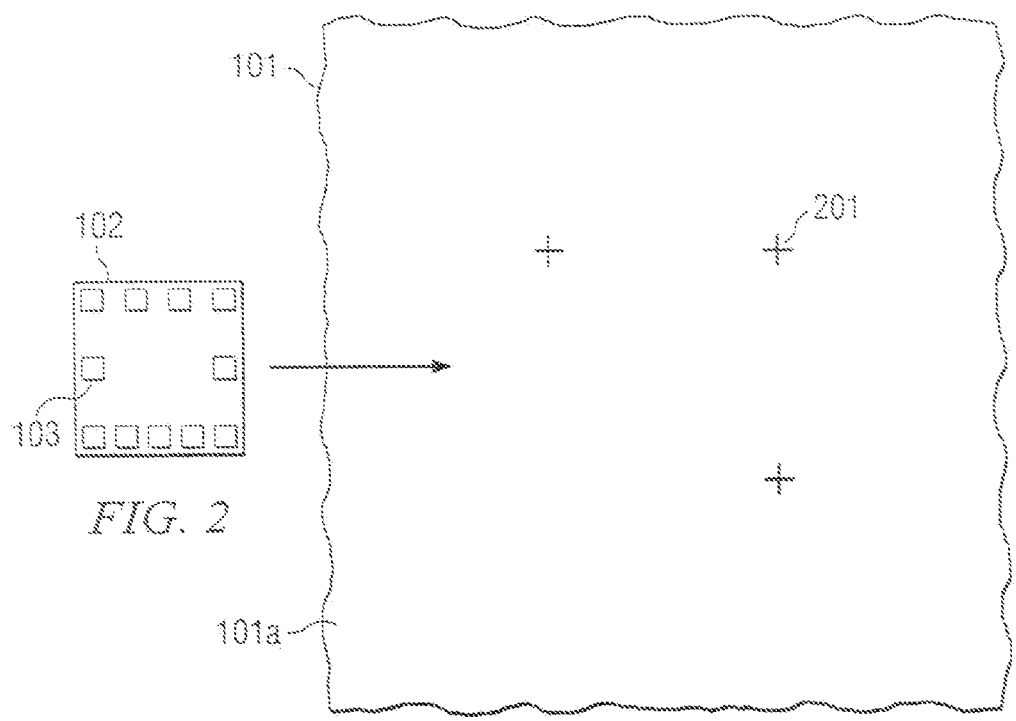

A semiconductor chip, 102 in FIG. 1A and 120 in FIG. 1B, is placed on the tacky surface 101a of tape 101. Chip 102/120 has an active surface 102a/120a with at least one bond pad 103/130, and a passive surface 102b/120a. The passive surface 102b/120b is adhering to tape surface 101a. The semiconductor chip may be a silicon integrated circuit chip, a discrete silicon device chip, or any other semiconductor chip made of silicon, silicon germanium, gallium arsenide or any other semiconductor material used for device production. The chip thickness is preferably equal or less than the thickness of the substrate (see FIGS. 3A and 3B); thickness 104 in FIG. 1A is less than the substrate thickness (302 in FIGS. 3A and 3B; for example, thickness 104 may be about 100 µm or less), while thickness 105 in FIG. 1B is approximately equal to the substrate thickness (for example, thickness 105 may be between 225 and 275 µm).

The top view of FIG. 2 illustrates schematically the process step of placing chip 102/120 on the adhesive surface 102a of support tape 102. The placement is supported by preprinted fiducials 201, which serve as alignment markers for positioning chip 102/120 and later the substrate. Chip 102/120 has a plurality of bond pads 103/130.

Figure 3A:
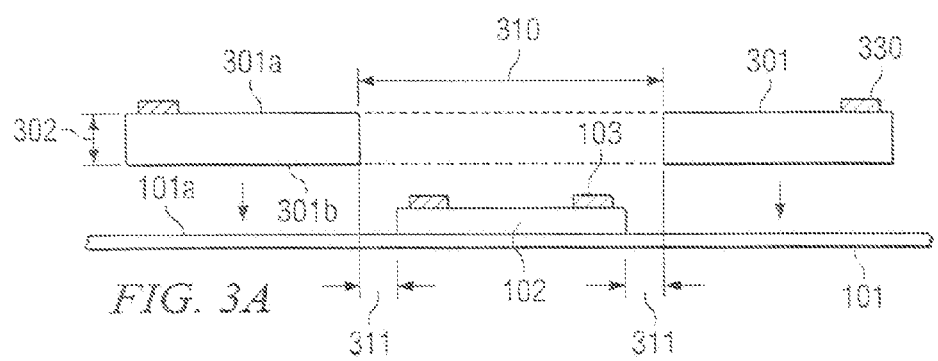
FIG. 3A is a schematic cross section of the support tape with attached chip and the (thicker) substrate.
Figure 3B:
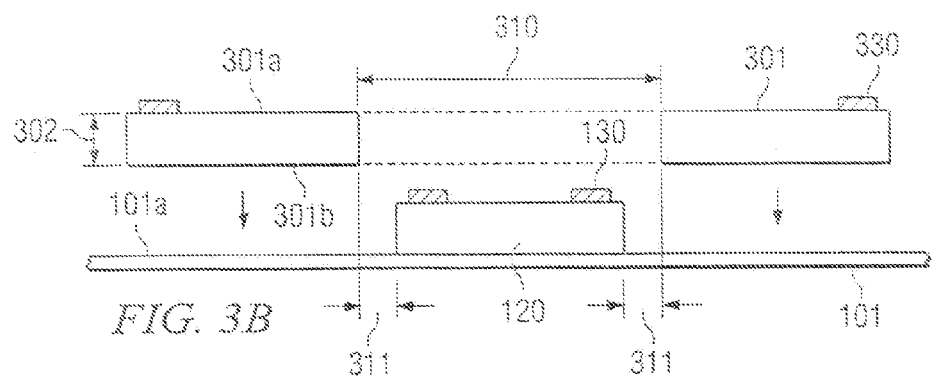
FIG. 3B is a schematic cross section of the support tape with attached chip and the (equally thick) substrate.

FIGS. 3A and 3B illustrate schematically the process step of placing substrate 301 on the adhesive surface 101a of support tape 101. Substrate 301 is an electrically insulating material, preferably sheet-like, selected from a group consisting of FR-4, FR-5, fiberglass, polyimide and related polymers. The thickness 302 of substrate 301 is in the range from about 50 to 300 µm. Substrate 301 has a first surface 301a and a second surface 301b; the second surface 301b is adhering to tape surface 101a. On first surface 301a is a plurality of electrically conductive routing strips (shown in FIG. 4) and a plurality of contact pads 330. Contact pads 330 are electrically connected with the respective routing strips 340 (shown in FIG. 4).

In FIGS. 3A and 3B, substrate 301 has one opening of width 310 (in FIGS. 14 and 15, more than one opening is shown); the opening may be shaped as a rectangle, a square, a circle or any other geometry. The width 310 of the opening is sized so that it is suitable to have chip 102 (in FIG. 3A) or chip 120 (in FIG. 3B) placed inside the opening, while leaving a gap 311 to the substrate, between chip edge and substrate edge.

Figure 4:
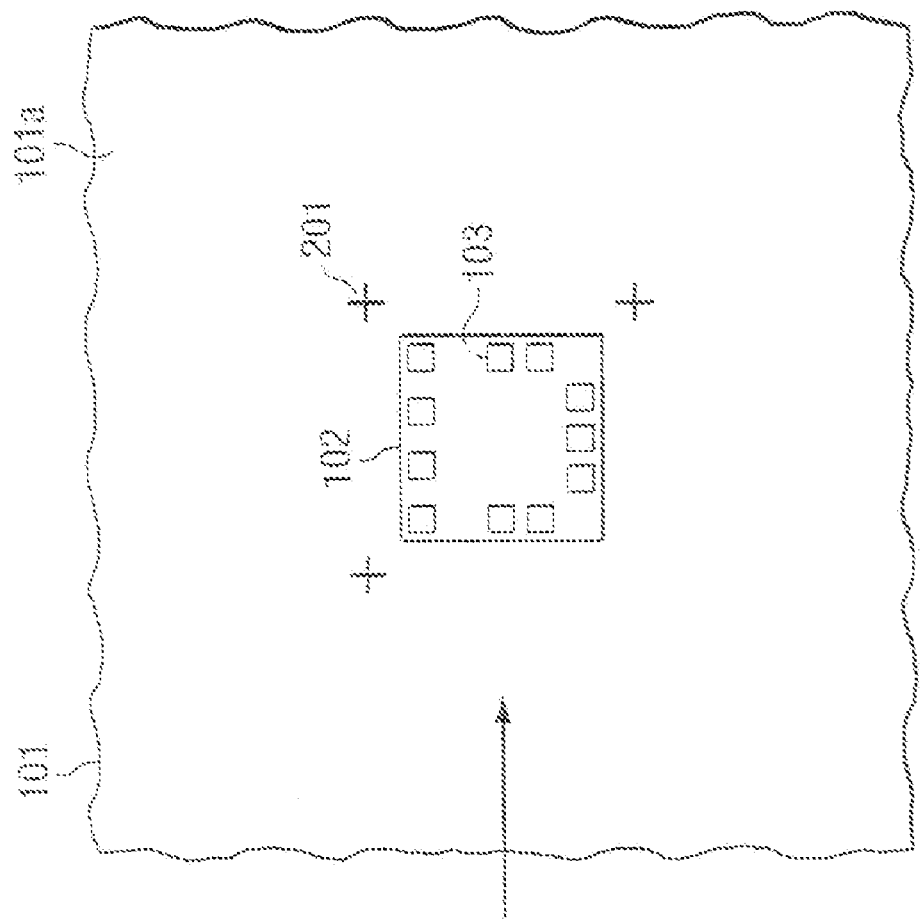
Figure 4:
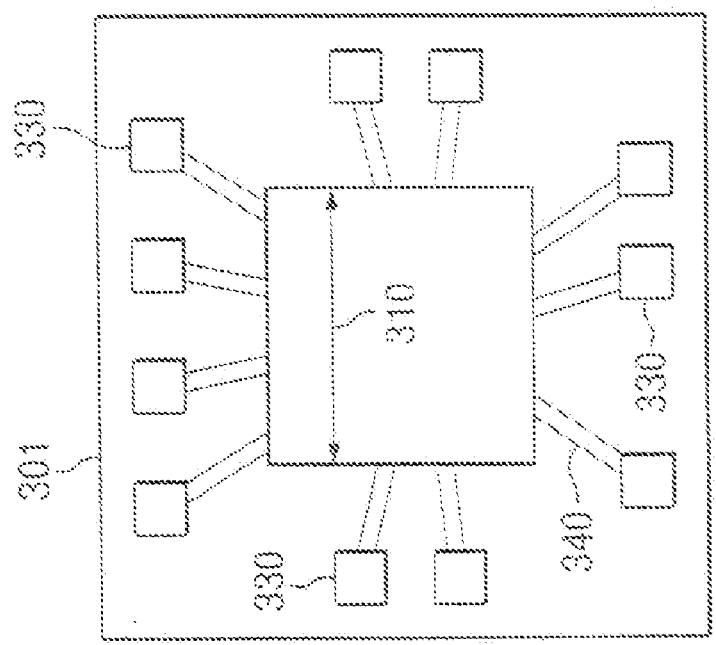

The top view of FIG. 4 depicts schematically the process step of placing substrate 301 on the adhesive surface 102a of support tape 102. The placement is supported by pre-printed fiducials 201, which serve as alignment markers for positioning substrate 301 around chip 102/120. The top view of substrate 301 in FIG. 4 displays the plurality of contact pads 330 and electrically conductive routing strips 340.

Figure 5A:
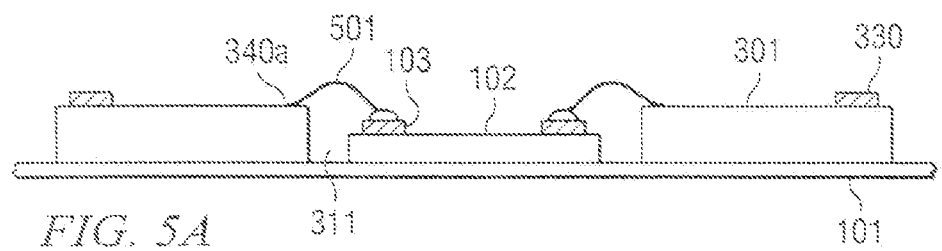
FIG. 5A is a schematic cross section of the attached substrate and (thinner) chip, illustrating interconnecting wire bonds.
Figure 5B:
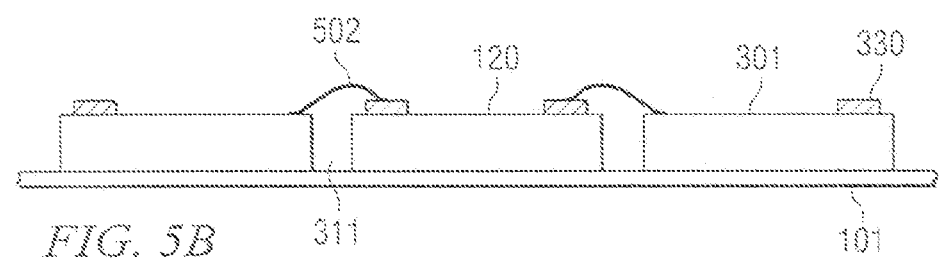
FIG. 5B is a schematic cross section of the attached substrate and (equally thick) chip, illustrating interconnecting wedge bonds.

The schematic cross sections of FIGS. 5A and 5B illustrate the process step of bridging the gap 311 between chip 102, or 120 respectively, and substrate 301 by bonding elements to connect electrically the chip bond pads to the substrate routing strips, respectively. In FIG. 5A, wire ball bonds 501 are used to connect chip bond pad 103 to the tip 340a of substrate routing strip 340 (see FIG. 6). In FIG. 5B, an analogous connection is achieved using wedge bonds 502. For both types of bonding techniques, the wire or ribbon looping is preferably held low in order to support the goal of fabricating low-profile devices. Low loops are facilitated by narrow gaps 311. A suitable technique for low-loop wire bonds has been filed as U.S. patent application Ser. No. 10/395,584, on Mar. 24, 2003 (Ano, "Wire Bonding for Thin Semiconductor Package").

Figure 6:
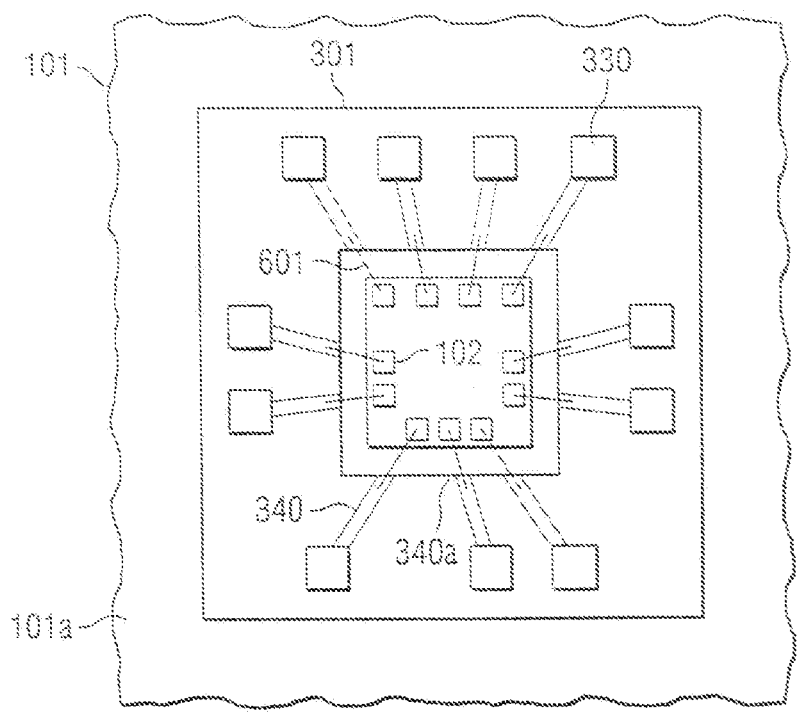

The schematic top view of FIG. 6 shows a plurality of bonding elements 601 connecting each chip bond pad 102/120 to its respective tip 340a of substrate routing strip 340.

Figure 7A:
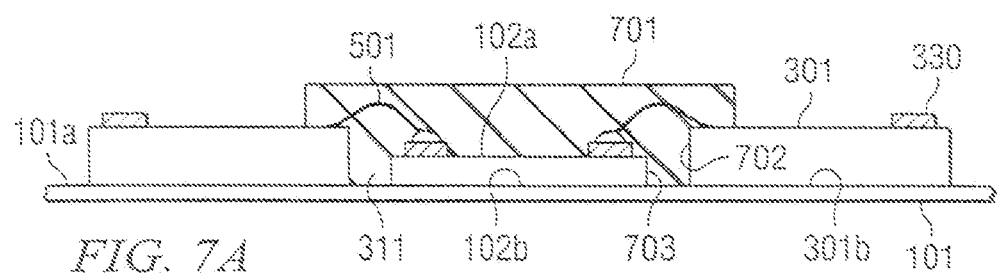
FIG. 7A is a schematic cross section of the encapsulated, wire bonded chip and substrate assembly.
Figure 7B:
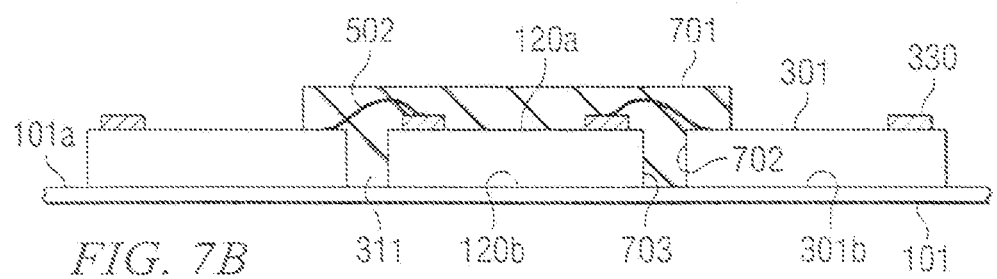
FIG. 7B is a schematic cross section of the encapsulated, wedge bonded chip and substrate assembly.

FIGS. 7A and 7B depict the process step of filling gap 311 and of encapsulating active chip surface 102a, or 120a respectively, and bonding elements 501, or 502 respectively, with an encapsulation material 701. This encapsulation material is selected so that it adheres to the side surfaces 702 of the substrate and the side surfaces 703 of the chip, which face the opening 311. Consequently, this process step achieves protection as well as coherence of the device parts. Since gaps 311 are filled with encapsulation material up to support tape surface 101a, the encapsulation material surface at 101a is substantially coplanar with passive chip surface 102b, or 120b respectively, and second substrate surface 301b.

Figure 8:
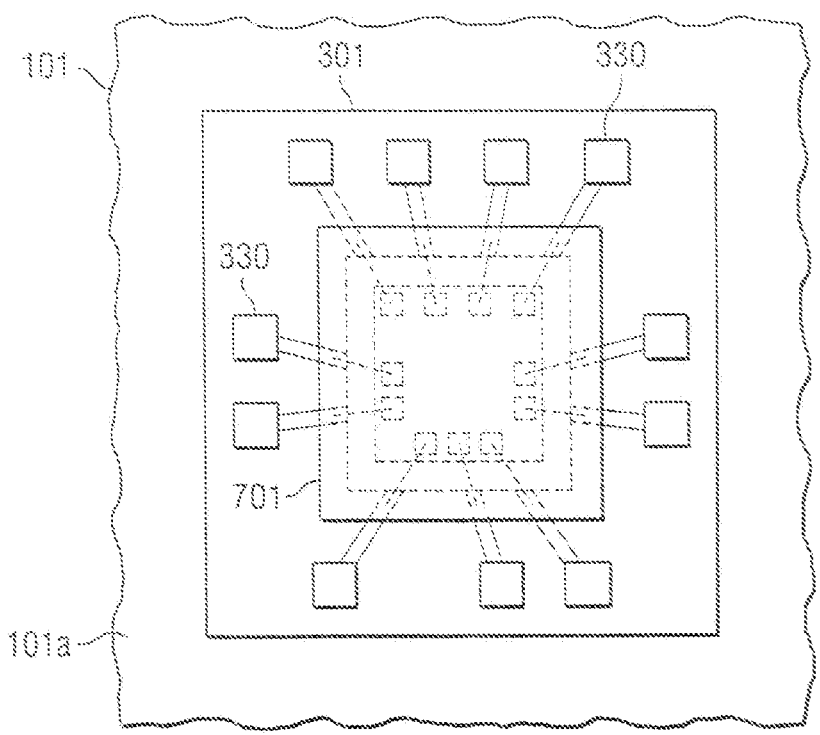
Figure 9A:
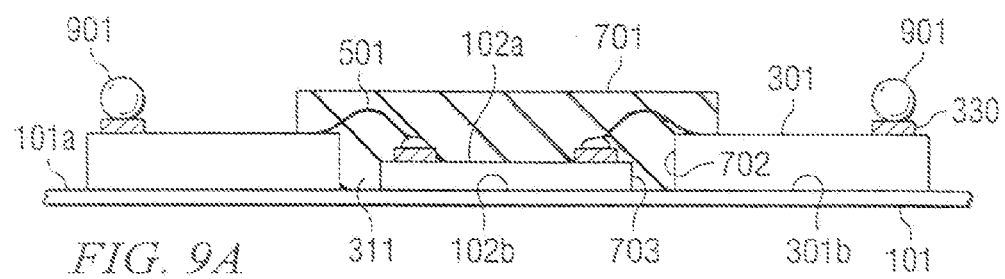
FIG. 9A shows a schematic cross section of the wire-bond assembled chip and substrate with solder bodies attached.
Figure 9B:
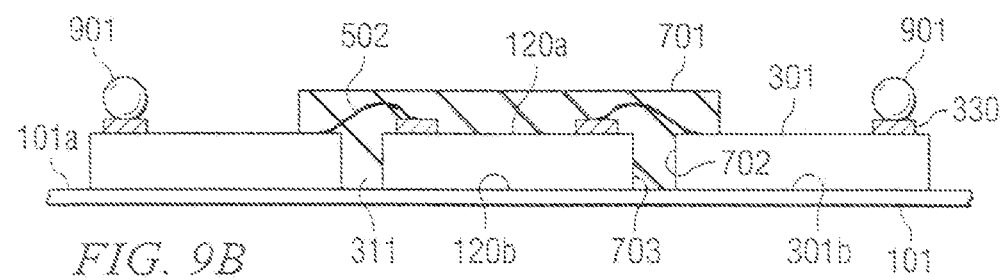
FIG. 9B shows a schematic cross section of the wedge-bond assembled ship and substrate with solder bodies attached.
Figure 10:
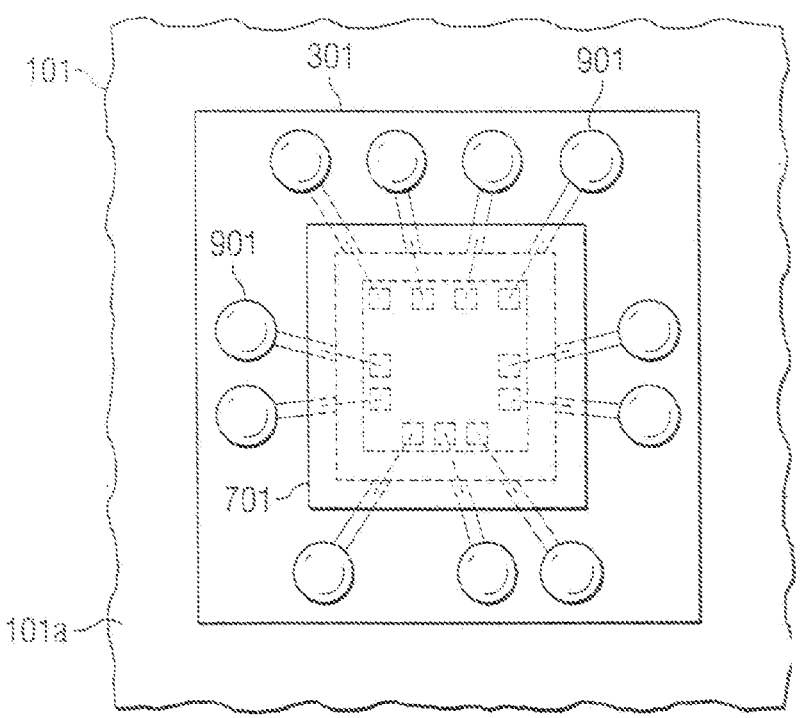

The schematic top view of FIG. 8 indicates that encapsulation material 701 leaves the substrate contact pads 330 exposed for the subsequent attachment of solder bodies. FIGS. 9A and 9B illustrate this attachment of solder bodies 901 on encapsulated devices with wire bonding (FIG. 9A) and wedge bonding (FIG. 9B). The top view of FIG. 10 shows a solder body 901 attached to each of the substrate contact pads.

Figure 11A:
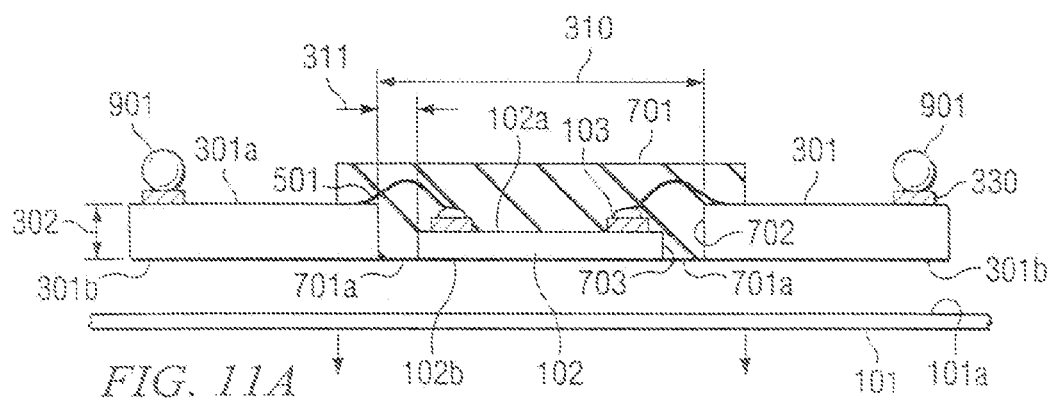
FIG. 11A illustrates schematically the process step of removing the support tape from the packaged device in FIG. 9A.
Figure 11B:
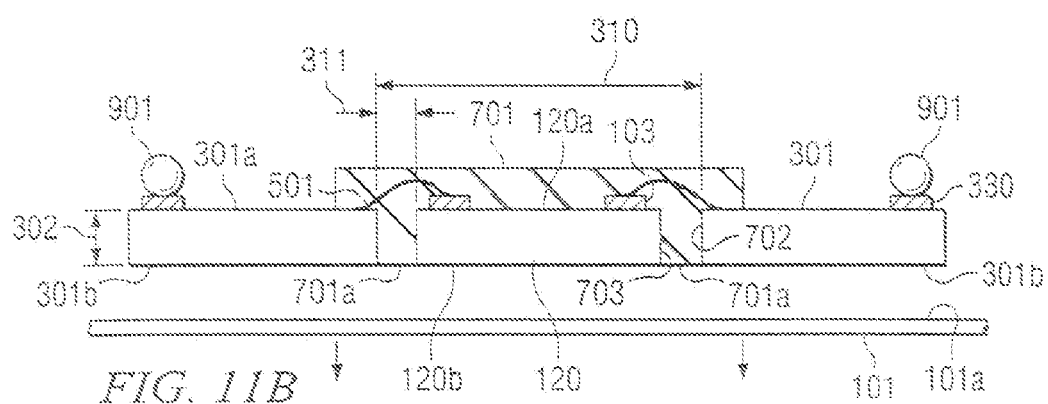
FIG. 11B illustrates schematically the process step of removing the support tape from the packaged device in FIG. 9B.

The final step of the assembly and packaging process flow is the removal of support tape 101 from the finished devices. The tape removal step is schematically illustrated in FIG. 11A for a wire bonded device and in FIG. 11B for a wedge bonded device. This step exposed for both device types the second substrate surface 301b, the passive chip surface 102b/120b, and the coplanar surface of the device encapsulation; it is designated 701a in FIGS. 11A and 11B. The coplanarity of these three surfaces characterize the use of support tape 101 during the fabrication process flow.

Figure 12:
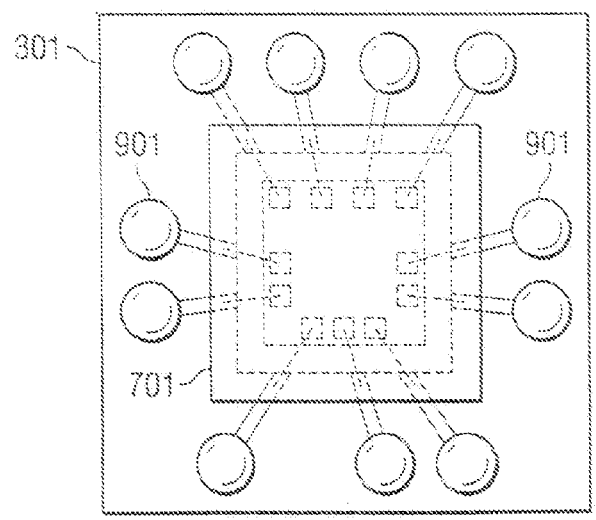
Figure 13A:
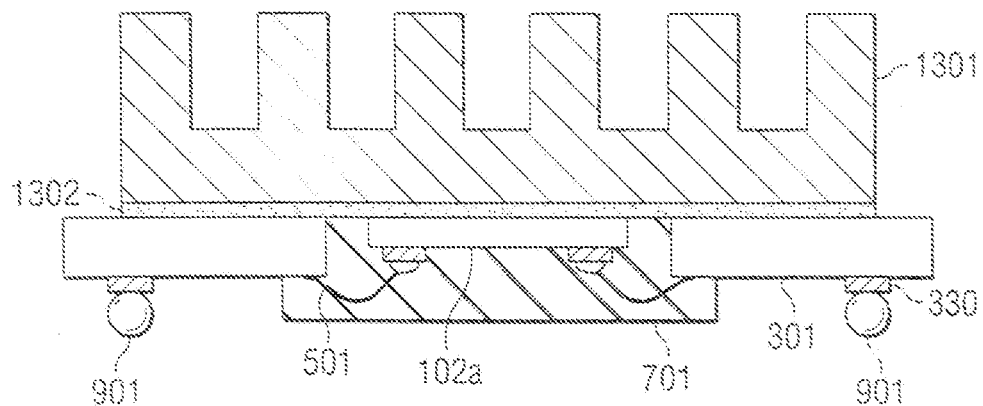
FIG. 13A shows a schematic cross section of the device in FIG. 11A with a heat sink attached.
Figure 13B:
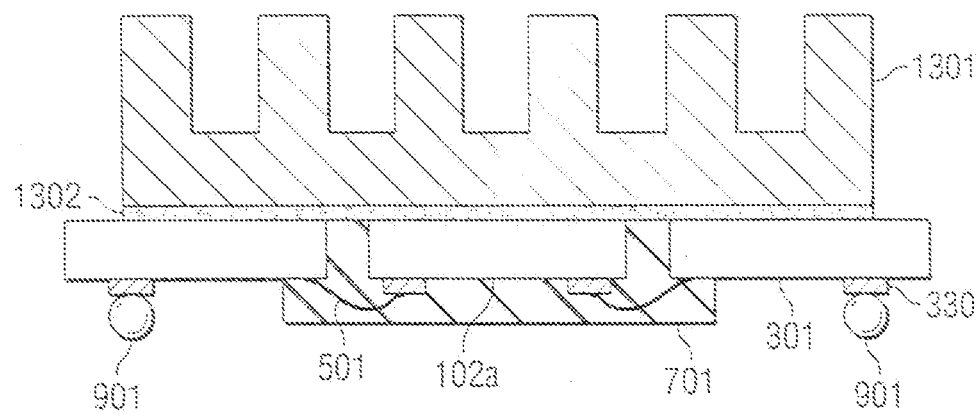
FIG. 13B shows a schematic cross section of the device in FIG. 11B with a heat sink attached.

FIG. 12 depicts the finished device without the support tape. The coplanar back surface of this product provides, after flipping the device, a flat surface for attaching a heat spreader for improving thermal device performance. These heat spreaders can be made in a wide variety of shapes and sizes; an example of a particular heat spreader design 1301 is schematically illustrated in FIGS. 13A (wire bonded device) and 13B (wedge bonded device). The attachment is typically performed by means of a thermally conductive adhesive 1302, for example, a silver-filled epoxy.

Figure 14:
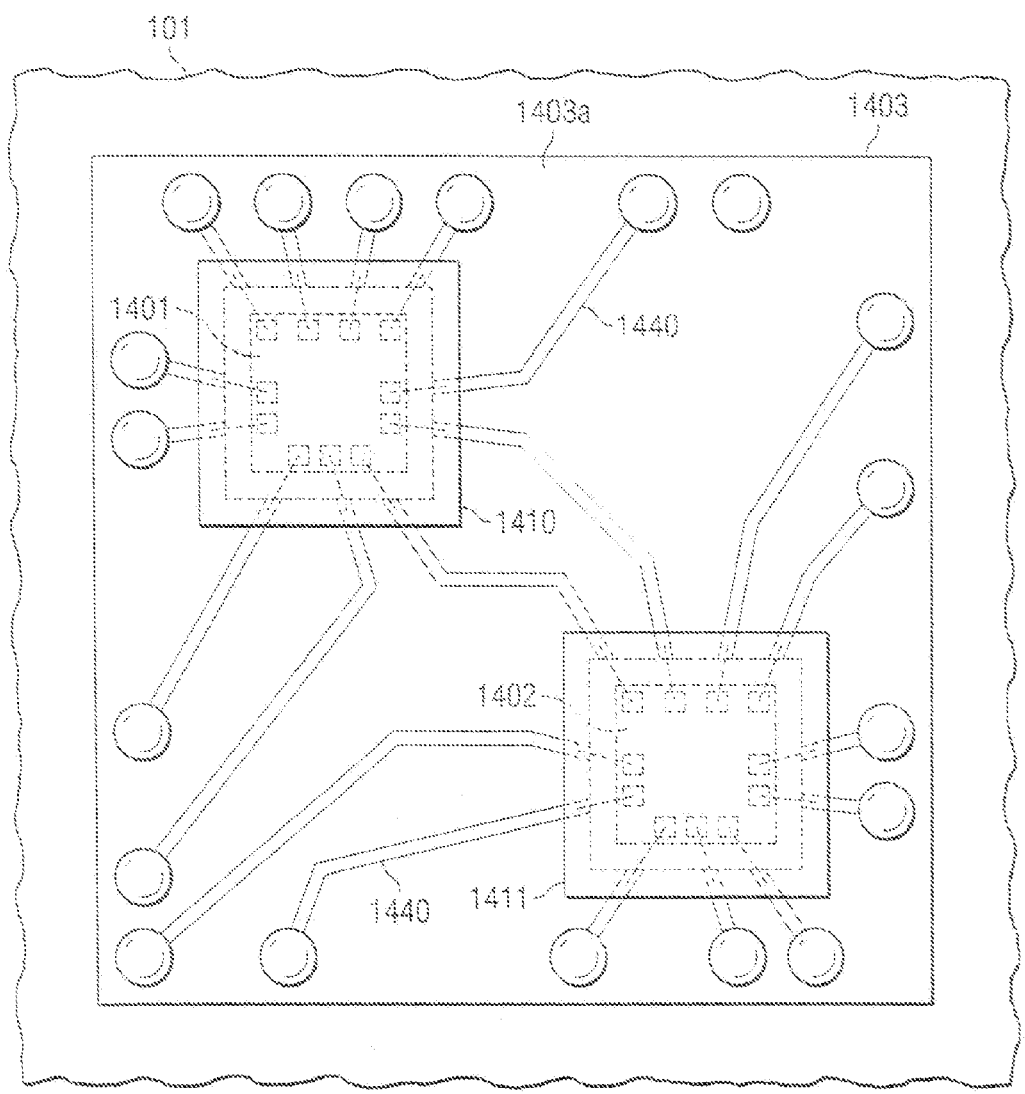
FIG. 14 is a schematic top view of a multichip device assembled on a support tape according to another embodiment of the invention.
Figure 15:
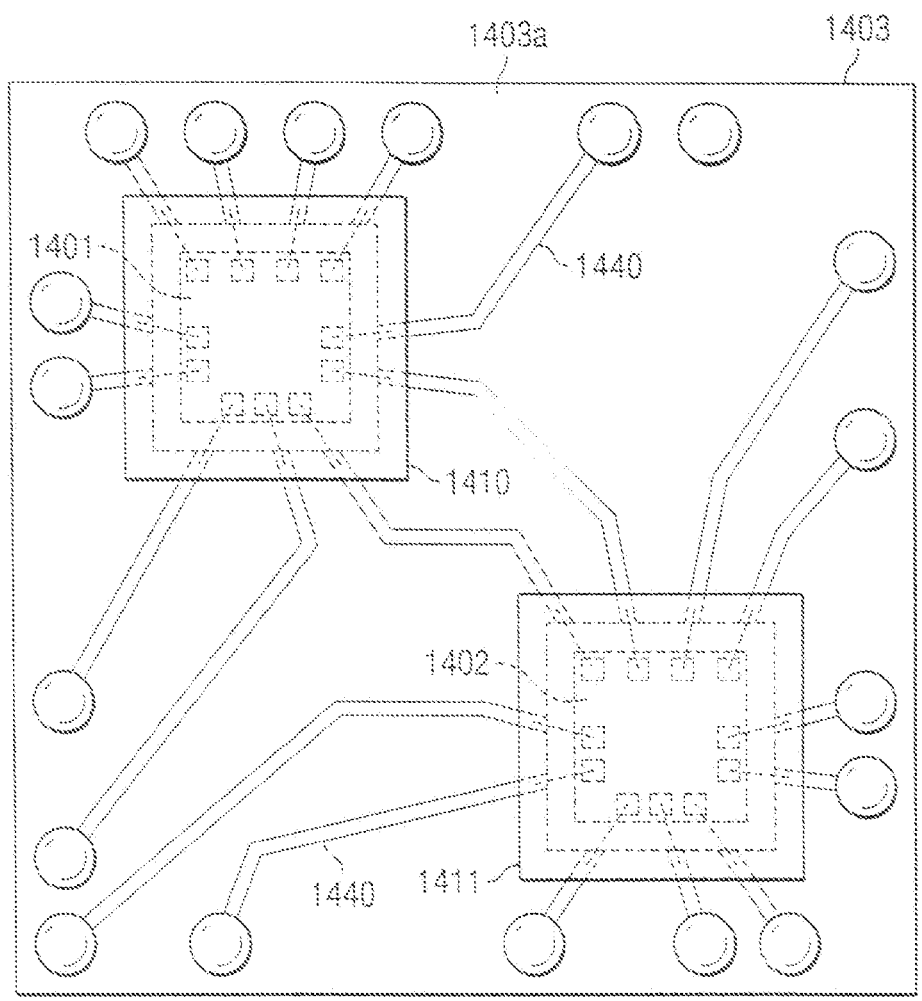
FIG. 15 is a schematic top view of the multichip device of FIG. 14 after discarding the support tape.

In another embodiment of the invention, the approach of the assembly concept described in FIGS. 1 through 12 can be expanded to multi-chip devices. The substrate provides part of the chip interconnections. An example of a two-chip device is schematically illustrated in the top views of FIG. 14 (support tape 101 still attached) and FIG. 15 (after removal of support tape). The first chip 1401 and the second chip 1402 may belong to different device families (different area sizes), or they may be from the same family (same area size). The first surface of substrate 1403 is shown in FIGS. 14 and 15 together with the electrically conductive routing strips 1440. The joint substrate 1403 has a plurality of openings (two openings in FIGS. 14 and 15, designated 1410 and 1411) and one semiconductor chip positioned in each of the openings so that a gap is left between each chip and the respective substrate opening. These gaps are bridged by bonding elements and then filled with an encapsulant, which adheres to chip and substrate opening sides. This coplanarity ensures that the passive surfaces of all chips are coplanar with the second surface of the substrate. Consequently, a heat spreader for improving thermal characteristics can be attached to the coplanar device surface.

FIGS. 16 to 22 illustrate schematically selected process steps of a fabrication flow for a low-profile, chip-scale, multi-chip device according to another embodiment of the invention. In this device, two chips are assembled by stacking in the opening of a substrate, which surrounds the multi-chip stack; a device example having three chips is indicated in FIG. 23. The assembly and packaging sequence is again based on a removable support tape with an adhesive upper surface.

Figure 16:
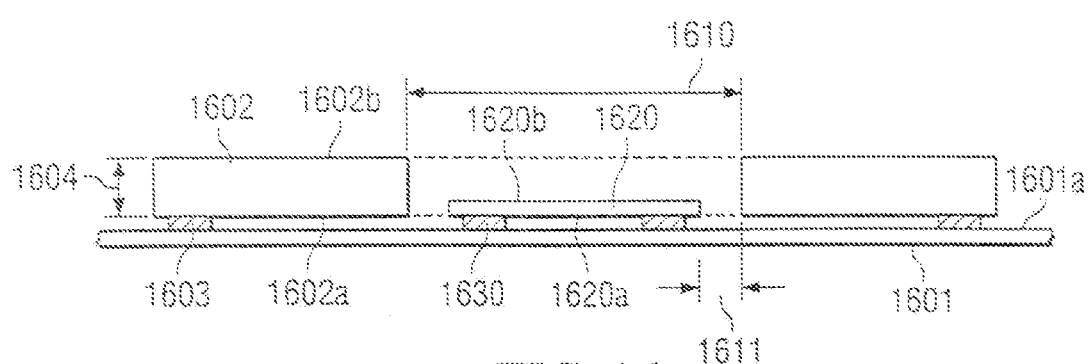
FIGS. 16 to 22 illustrate schematically selected steps of the process flow for fabricating a low-profile, chip-scale, multi-chip device according to another embodiment of the invention.
Figure 17:
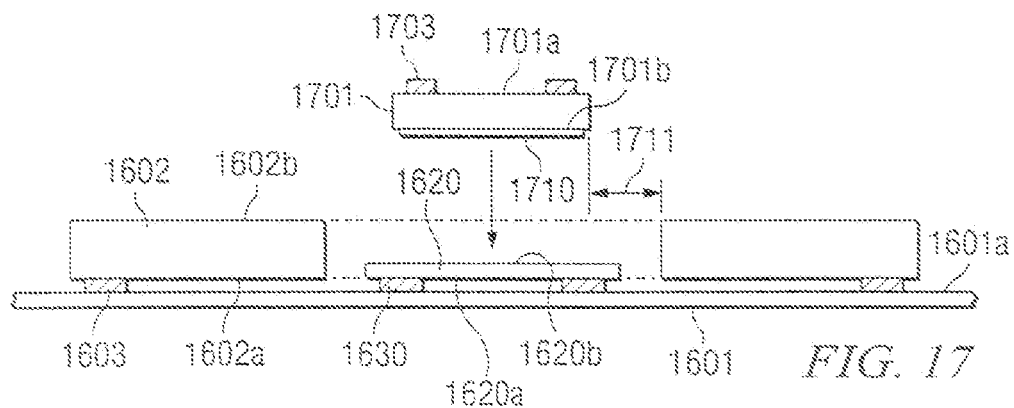
Figure 24:
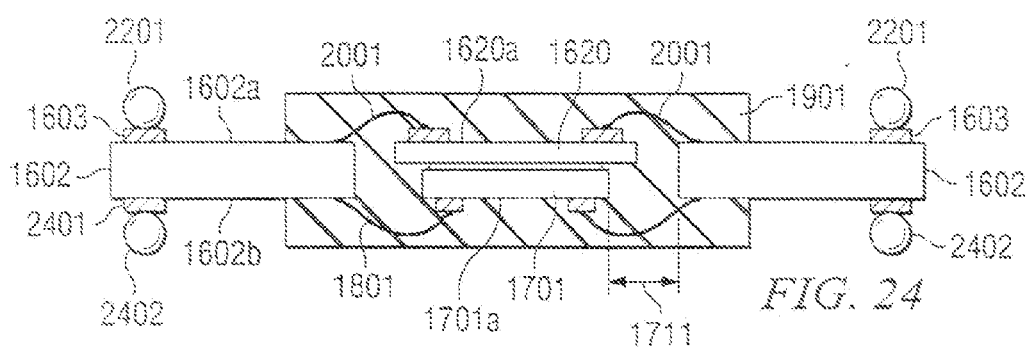
FIG. 24 is a schematic cross section of the encapsulated multi-chip device with solder bodies attached on both surface of the substrate.

In FIG. 16, the removable support tape 1601 is oriented with its adhesive surface 1601a upwards. An electrically insulating substrate 1602 (preferably sheet-like) has first surface 1602a, which includes electrically routing strips (not shown in FIG. 16) and contact pads 1603. The contact pads 1603 are electrically connected with the routing strips, respectively. Substrate 1602 further has second surface 1602b, which has electrically conductive routing strips integral with surface 1602b. In another embodiment, indicated in FIG. 24, second surface 1602b also has contact pads; the contact pads are electrically connected, respectively, with the routing strips on surface 1602b. As FIG. 16 shows, substrate 1602 is oriented with its first surface 1602a to face tape 1601, where substrate surface 1602 is attached to the tacky surface 1601a of the tape.

Substrate 1602 is shown in FIG. 16 to have one opening of width 1610; for other embodiments, substrates with more than one opening may be used. Width 1610 is dimensioned to position the chip with the greatest dimension of the stack inside the opening while leaving a gap to the substrate sides of the opening. Substrate 1602 further has a thickness 1604 approximately equal to the sum of the thicknesses of the chips in the stack.

After substrate 1602 has been placed on support tape 1601, with its first surface 1602 facing the tacky side of tape 1601, a first semiconductor chip 1620 is provided, which has an active surface 1620a including bond pads 1630, a passive surface 1620b, and a thickness approximately half the substrate thickness 1604. The active surface 1620a of first chip 1620 is placed on the adhesive tape surface 1601a in the substrate opening 1610, while leaving a first gap 1611 to the substrate.

Next, a second semiconductor chip 1701 is provided (see FIG. 17), which has an active surface 1701a including bond pads 1703, a passive surface 1701b, and a thickness approximately half said substrate thickness 1604. The passive surface 1701b of second chip 1701 is attached to the passive surface 1620b of the first chip 1620 by means of adhesive material 1710, while leaving a second gap 1711 to substrate 1602.

Figure 18:
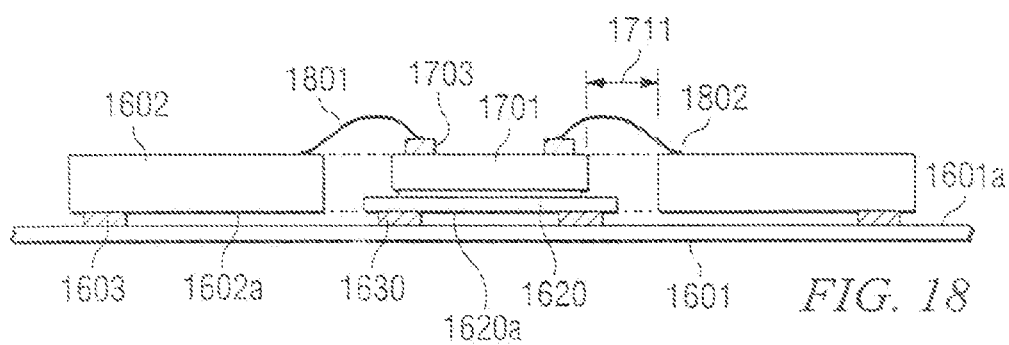

As FIG. 18 shows, second gap 1711 is bridged by bonding elements 1801 to connect electrically bond pad 1703 of second chip 1701 to substrate routing strips designated 1802 in FIG. 18.

Figure 19:
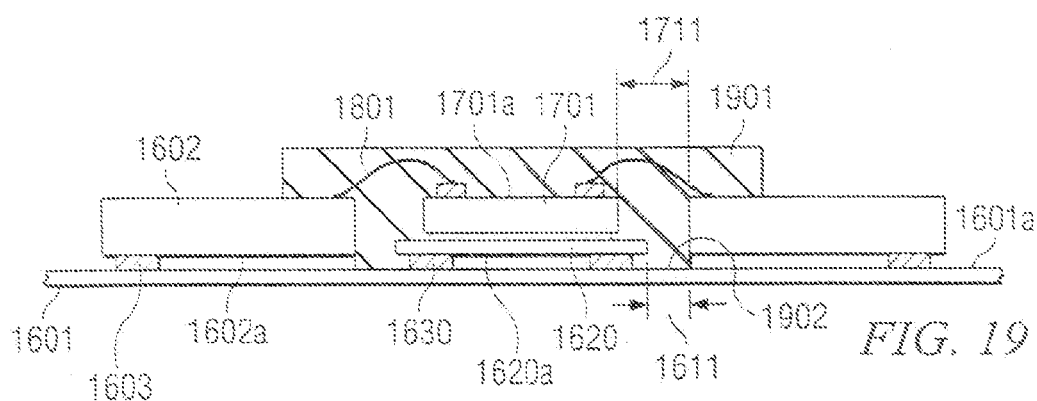

Next, as indicated in FIG. 19, second gap 1711 and first gap 1611 are filled with encapsulation material 1901 (for instance, epoxy). The interface 1902 of the gap fillings is coplanar with the first surface 1602a of the substrate and active surface 1620s of first chip 1620. In the same process step, material 1901 encapsulates the active surface 1701a and the bonding elements 1801 of second chip 1701. The assembly is at this stage flipped and support tape 1601 is removed and discarded.

Figure 20:
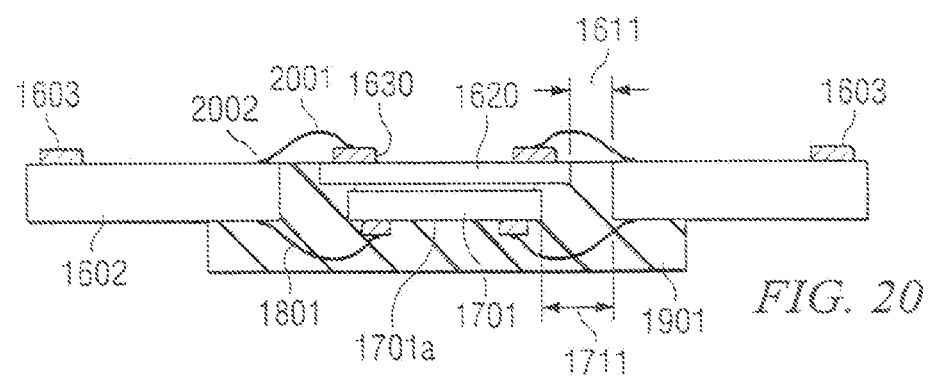
Figure 21:
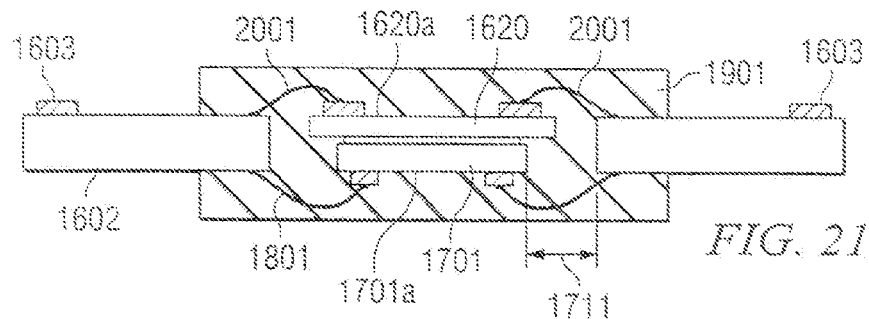

It is shown in FIG. 20 that in the next step first gap 1611 is bridged by bonding elements 2001 in order to connect electrically bond pads 1630 of first chip 1620 to substrate routing strips 2002 in FIG. 20. As FIG. 21 indicates, a second encapsulation step is employed to encapsulate the active surface 1620a and the bonding elements 2001 of first chip 1620. This encapsulation step leaves contact pads 1603 of the substrate exposed.

Figure 22:
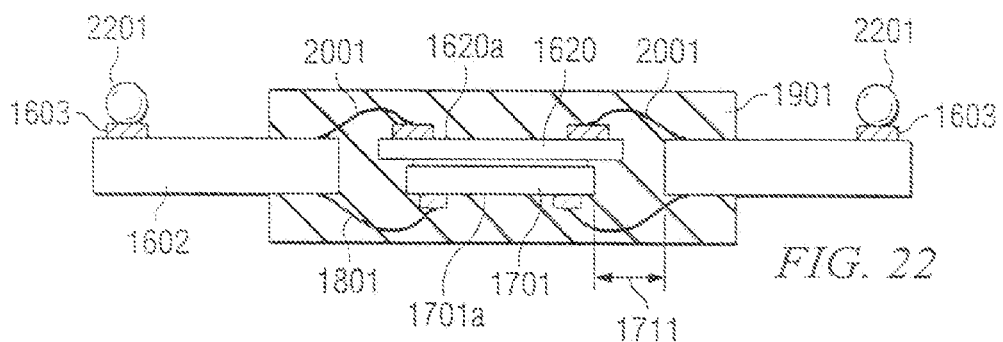
Figure 23:
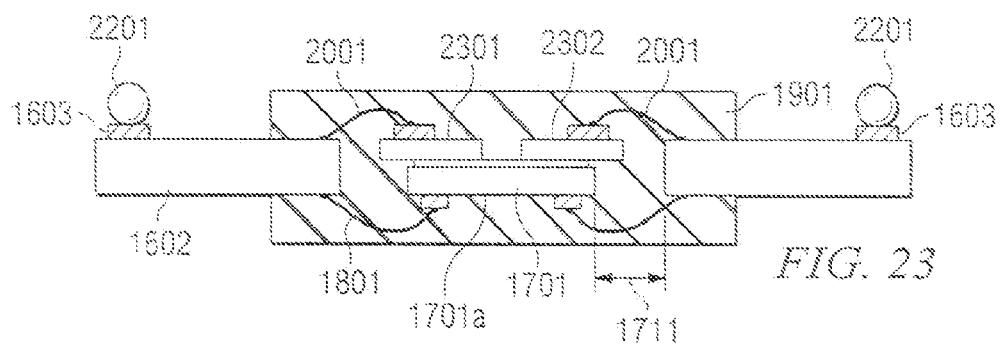
FIG. 23 is a schematic cross section of the encapsulated multi-chip device with solder bodies attached, the multi-chip comprising more than two chips.

As the last process step, FIG. 22 illustrates the attachment of solder bodies 2201 on contact pads 1603. When embodiments (see FIG. 24) use a substrate 1602 with contact pads 2401 also on the second surface 1602b, solder bodies 2402 may also be attached to these contact pads 2401. It should be stressed, however, that an alternative to the solder body method is available, when pressure contacts are employed to provide electrical contact to pads 2401 as well as 1603.

As mentioned earlier, FIG. 23 displays an embodiment where the first chip 1602 in FIG. 16 is replaced by two separate chips 2301 and 2302. Analogous to the process step shown in FIG. 16, these two chips are attached to the support tape with their active surfaces, and analogous to the process step shown in FIG. 20, the chips are bonded to the substrate strips only after the support tape has been removed.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, a first encapsulation step may be employed for the stacked multi-chip embodiment, after the step of placing the first chip on the tape; this encapsulation step fills the first gap with encapsulation material.

It is therefore intended that the appended claims encompass any such modifications or embodiments.

We claim:

1. A method for assembling a semiconductor device comprising the steps of:

providing a support tape having an adhesive upper surface with preprinted fiducials;

providing an electrically insulating substrate having first and second surfaces, at least one opening and a thickness; a plurality of electrically conductive routing strips on said first surface; and a plurality of contact pads disposed on said first surface, at least one of said contact pads electrically connected with at least one of said routing strips;

aligning said substrate to the preprinted fiducials and placing said substrate on said adhesive tape surface;

providing a semiconductor chip having an active surface including at least one bond pad, and a passive surface;

placing said passive chip surface on said adhesive tape surface in said at least one substrate opening aligning the first semiconductor chip to the preprinted fiducials while leaving a gap to said substrate;

bridging said gap by bonding elements to connect electrically said at least one bond pad to at least one of said routing strips; and filling said gap and encapsulating said active chip surface and said bonding elements.

2. The method according to claim 1 further comprising the step of removing said support tape after said step of filling and encapsulating.

3. The method according to claim 1 wherein said step of encapsulating is performed selectively so that said plurality of contact pads remains exposed.

4. The method according to claim 3 further comprising the step of attaching at least one solder body on at least one of said contact pads.

5. The method according to claim 1 further comprising the steps of:

providing a substrate having a plurality of openings;

providing a semiconductor chip having active and passive surfaces for each of said openings; and placing each chip with its passive surface on said adhesive tape surface in the respective tape opening while leaving a gap to said substrate.

6. The method according to claim 1 wherein said insulating support tape is a polyimide foil, having a low-strength adhesive on one surface, in the thickness range from about 25 to 100 μm.

7. The method according to claim 1 wherein said substrate is selected from a group consisting of FR-4, FR-5, fiberglass, polyimide and related polymers in the thickness range from about 50 to 300 μm for single chip devices, and 50 to 600 μm for stacked-chip devices.

8. The method according to claim 1, further comprising a step of disposing a second semiconductor chip to the first semiconductor chip.

* * * * *